(12) United States Patent
Takizawa

(10) Patent No.: US 7,768,793 B2
(45) Date of Patent: Aug. 3, 2010

(54) MULTILAYER PRINTED WIRING BOARD, METHOD OF MANUFACTURING MULTILAYER PRINTED WIRING BOARD AND ELECTRONIC APPARATUS

(75) Inventor: Minoru Takizawa, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 289 days.

(21) Appl. No.: 11/524,688

(22) Filed: Sep. 21, 2006

(65) Prior Publication Data

US 2007/0074901 A1 Apr. 5, 2007

(30) Foreign Application Priority Data

Sep. 30, 2005 (JP) ............................. 2005-288384

(51) Int. Cl.
*H05K 7/00* (2006.01)
(52) U.S. Cl. ...................................... 361/760; 174/250
(58) Field of Classification Search ................ 174/261, 174/250; 361/735, 760
See application file for complete search history.

(56) References Cited

U.S. PATENT DOCUMENTS

| | | | | |
|---|---|---|---|---|
| 6,487,083 B1 * | 11/2002 | Kwong | ........................ | 361/761 |
| 6,714,418 B2 * | 3/2004 | Frankowsky et al. | ......... | 361/735 |
| 6,975,516 B2 * | 12/2005 | Asahi et al. | .................. | 361/761 |
| 7,282,394 B2 * | 10/2007 | Cho et al. | .................... | 438/118 |
| 2008/0169546 A1 * | 7/2008 | Kwon et al. | ................. | 257/686 |

FOREIGN PATENT DOCUMENTS

| | | |
|---|---|---|
| CN | 1418048 A | 5/2003 |
| CN | 1213646 C | 8/2005 |
| JP | 2002-176267 | 6/2002 |
| JP | 2005-6279 | 1/2005 |
| JP | 2005-142178 | 6/2005 |
| JP | 2005-243911 | 9/2005 |
| WO | WO2004034759 | * 4/2004 |

OTHER PUBLICATIONS

An English translation of Notification of the First Office Action mailed by State Intellectual Property Office of P.R.C. on Oct. 16, 2009 for corresponding Chinese patent application No. 200610152399.0.

* cited by examiner

*Primary Examiner*—Jeremy C Norris
*Assistant Examiner*—Yuriy Semenenko
(74) *Attorney, Agent, or Firm*—Knobbe, Martens, Olson & Bear LLP

(57) ABSTRACT

According to one embodiment of, a multilayer printed wiring board comprises an electronic part, a mount layer where the electronic part is mounted, a mount layer conductor pattern formed in the mount layer, an opposite layer containing the electronic part between itself and the mount layer, an opposite layer conductor pattern formed on the opposite layer and an electrically conductive connector contained between the mount layer and the opposite layer and electrically connecting the mount layer conductor pattern and the opposite layer conductor pattern to each other.

7 Claims, 12 Drawing Sheets

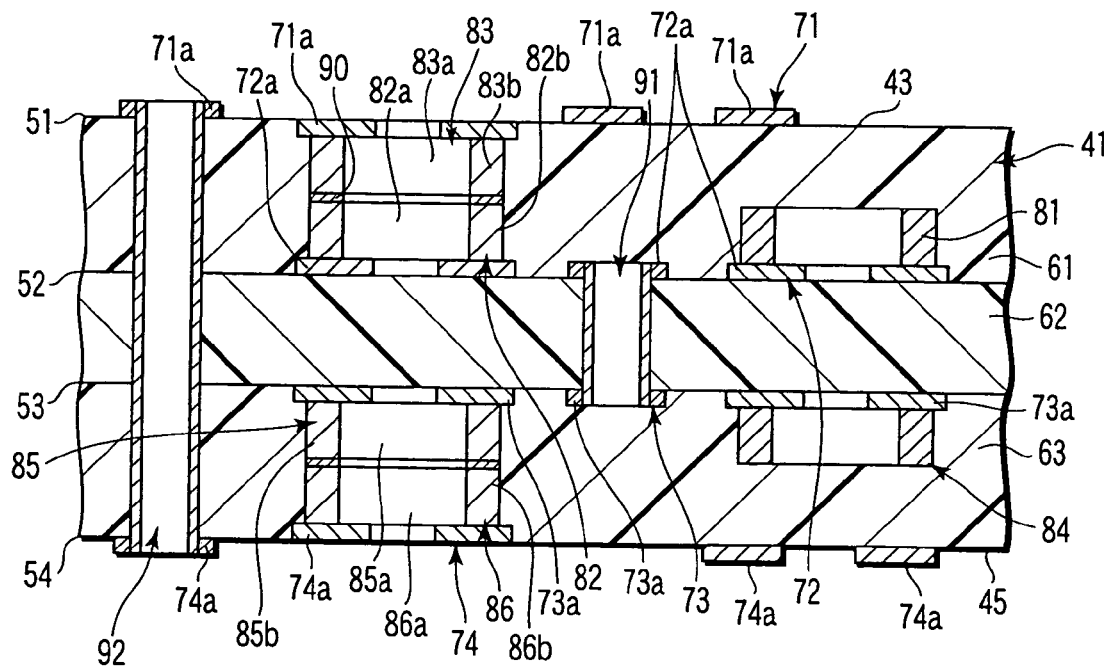
F I G. 5
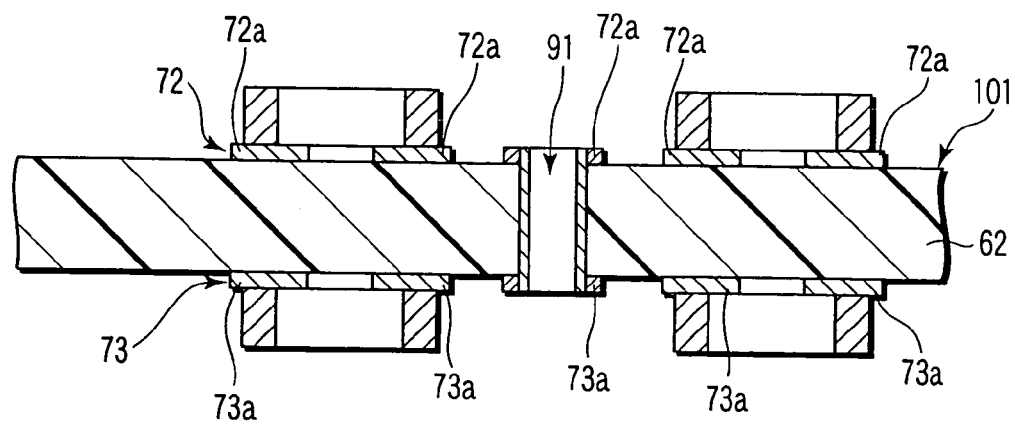
F I G. 6

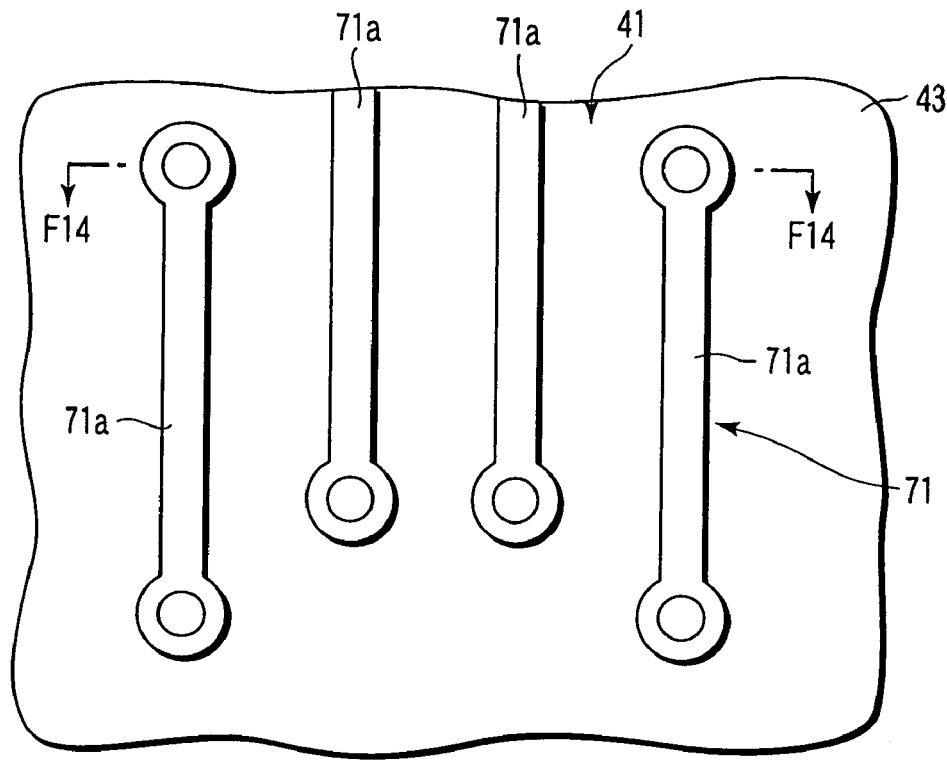
F I G. 12
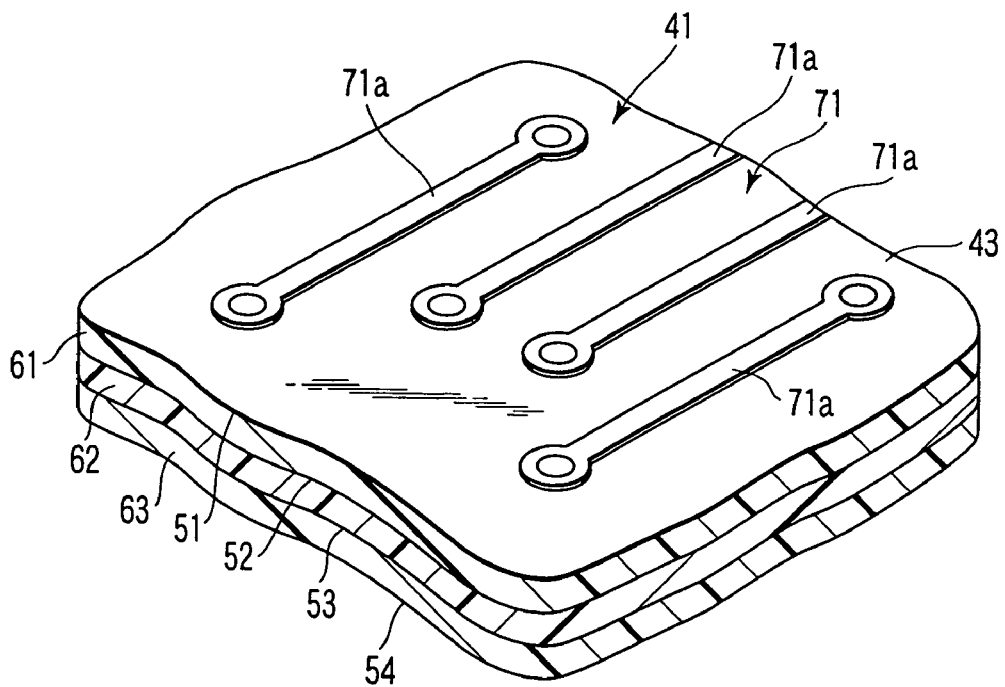
F I G. 13

MULTILAYER PRINTED WIRING BOARD, METHOD OF MANUFACTURING MULTILAYER PRINTED WIRING BOARD AND ELECTRONIC APPARATUS

CROSS-REFERENCE TO RELATED APPLICATIONS

This application is based upon and claims the benefit of priority from Japanese Patent Application No. 2005-288384, filed Sep. 30, 2005, the entire contents of which are incorporated herein by reference.

BACKGROUND

1. Field

One embodiment of the invention relates to a multilayer printed wiring board containing electronic parts, a method of manufacturing a multilayer printed wiring board containing electronic parts and an electronic apparatus having a multilayer printed wiring board containing electronic parts.

2. Description of the Related Art

Conventionally, multilayer printed wiring boards are often used in electronic apparatus. Multilayer printed wiring boards are currently made to contain electronic parts in the inside in order to raise the degree of freedom of designing the conductor pattern formed on the surface of the multilayer printed wiring board, although such electronic parts have often been mounted on the surface of the multilayer printed wiring board.

Generally, when a multilayer printed wiring board is made to contain electronic parts in the inside, the electronic parts are firstly mounted on the printed wiring board that operates as the core and an insulating layer that is typically a semi-hardened epoxy resin layer is laid on the layer of the mounted electronic parts by way of a press process. As a result, the electronic parts are contained in the inside.

In multilayer printed wiring boards of the above identified type, it is desirable that the patterns formed on the layers arranged vis-à-vis with the electronic parts to be contained in the inside interposed between them are electrically connected to each other for the purpose of raising the degree of freedom of pattern formation. However, it is actually difficult to electrically connect the patterns formed on the layers arranged vis-à-vis with the electronic parts to be contained in the inside interposed between them. This will be described below.

Generally, through holes are formed when the patterns formed in layers are to be electrically connected to each other. The through holes are made to run all the way from one of the surfaces of the multilayer printed wiring board to the other surface.

However, as pointed out above, the electronic parts to be contained in the inside are firstly mounted on the surface of the printed wiring board that operates as the core and subsequently an insulating layer is formed thereon by way of a press process to actually contain them in the inside.

Since another insulating layer is found under the layer where the electronic parts are mounted, it is difficult to form through holes only through the layer where the electronic parts are mounted and the layer arranged opposite to it. Therefore, it is difficult to electrically connect the patterns formed vis-à-vis with the electronic parts to be contained interposed between them.

Meanwhile, a parts-containing substrate of a multilayer structure of a plurality of insulating layers having bumps at terminal sections and containing electronic parts has been disclosed in Jpn. Pat. Appln. Publication No. 2002-176267.

However, the parts-containing substrate disclosed in Jpn. Pat. Appln. Publication No. 2002-176267 relates to a technique of containing electronic parts in insulating layers and is not for raising the degree of freedom of pattern formation.

BRIEF DESCRIPTION OF THE SEVERAL VIEWS OF THE DRAWINGS

A general architecture that implements the various feature of the invention will now be described with reference to the drawings. The drawings and the associated descriptions are provided to illustrate embodiments of the invention and not to limit the scope of the invention.

FIG. 5 is an exemplary cross sectional view of the multilayer printed wiring board of FIG. 3 taken along line F5-F5 in FIG. 3;

FIG. 6 is an exemplary cross sectional view of the first printed wiring board of the multilayer printed wiring board of the first embodiment of the present invention;

FIG. 12 is an exemplary enlarged plan view of the first conductor pattern formed on the upper surface of the multilayer printed wiring board of the fifth embodiment of the present invention;

FIG. 13 is an exemplary cross sectional view of the multilayer printed wiring board of the fifth embodiment of the present invention, illustrating the range shown in FIG. 12 as viewed obliquely from above;

DETAILED DESCRIPTION

Various embodiments according to the invention will be described hereinafter with reference to the accompanying drawings. In general, according to one embodiment of the invention, a multilayer printed wiring board comprising: an electronic part; a mount layer for mounting the electronic part; a mount layer conductor pattern formed in the mount layer; an opposite layer containing the electronic part between itself and the mount layer; an opposite layer conductor pattern formed in the opposite layer; and an electrically conductive connector contained between the mount layer and the opposite layer for electrically connecting the mount layer conductor pattern and the opposite layer conductor pattern to each other.

A multilayer printed wiring board manufacturing method of electrically connecting a mount layer conductor pattern formed in a mount layer mounting electronic part and an opposite layer conductor pattern formed in an opposite layer arranged opposite to the mount layer with the electronic part interposed between them;

the method being adapted to electrically connect the mount layer conductor pattern and the opposite layer conductor pattern by laying a first layered body for forming a multilayer, the first layered body having the mount layer conductor pattern on the surface thereof carrying the mount layer formed thereon, an electrically conductive first connector member and electronic part being electrically connected in the mount layer conductor pattern, and a second layered body for forming a multilayer, the second layered body having the opposite layer conductor pattern on the surface thereof carrying the opposite layer formed thereon, an electrically conductive second connector member being electrically connected in the opposite layer conductor pattern, with a third layered body for forming a multilayer interposed between the first layer and the second layer for a disposition of making the first connector member and the second connector member face each other and electrically connecting the first connector member and the second connector member to each other.

An electronic apparatus comprising a multilayer printed wiring board having: an electronic part; a mount layer for mounting the electronic part; a mount layer conductor pattern formed in the mount layer; an opposite layer containing the electronic part between itself and the mount layer; an opposite layer conductor pattern formed in the opposite layer; and an electrically conductive connector contained between the mount layer and the opposite layer for electrically connecting the mount layer conductor pattern and the opposite layer conductor pattern to each other.

Now, the first embodiment of an electronic apparatus according to the present invention, which is a portable computer 10, will be described by referring to FIGS. 1 through 8.

Figure 1:
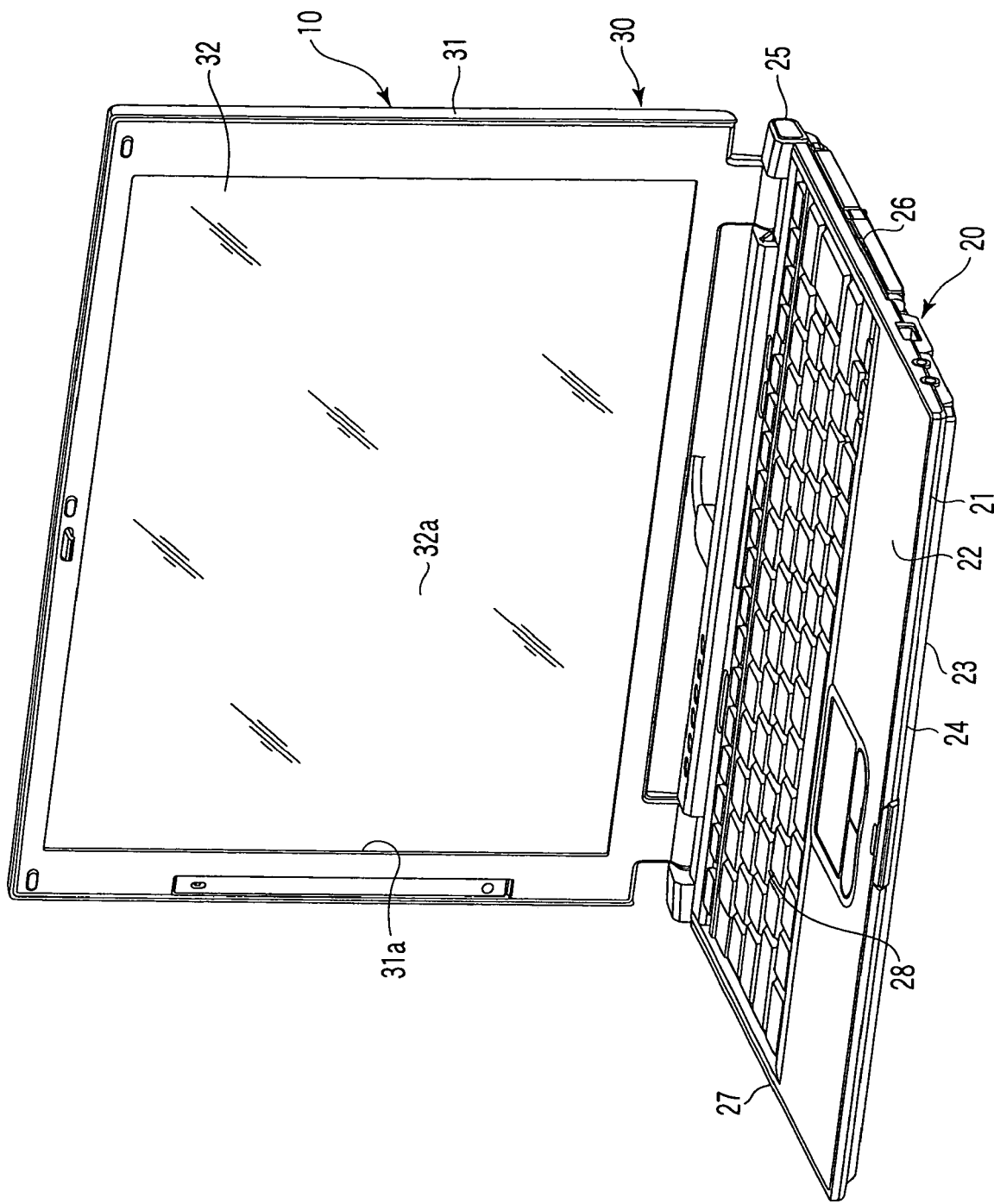
FIG. 1 is an exemplary perspective view of the first embodiment of the present invention, which is a portable computer.

FIG. 1 is a perspective view of the portable computer 10. Referring to FIG. 1, the portable computer 10 comprises a computer main body 20 and display unit 30.

The computer main body 20 has a cabinet 21 and a circuit module 40 which will be described in greater detail hereinafter. The cabinet 21 is flat and box-shaped. The cabinet 21 includes an upper wall 22, a lower wall 23, a front wall 24, a rear wall 25, a right wall 26 and a left wall 27. A keyboard 28 is arranged on the upper wall 22. The circuit module 40 is contained in the cabinet 21.

The display unit 30 includes a display unit housing 31 and a liquid crystal display panel 32. The liquid crystal display panel 32 is contained in the display unit housing 31. The liquid crystal display panel 32 has a screen 32a for displaying images. The screen 32a is exposed to the outside of the display unit housing 31 by way of an aperture section 31a formed at the front surface of the display unit housing 31. The display unit 30 is linked to the computer main body 20 by way of a hinge (not shown).

The display unit 30 is freely rotatable between a closed position and an open position. The display unit 30 lies on the computer main body 20 to cover the keyboard 28 from above in the closed position thereof. The display unit 30 stands from the computer main body 20 to expose the keyboard 28 and the screen 32a in the open position thereof.

Figure 2:
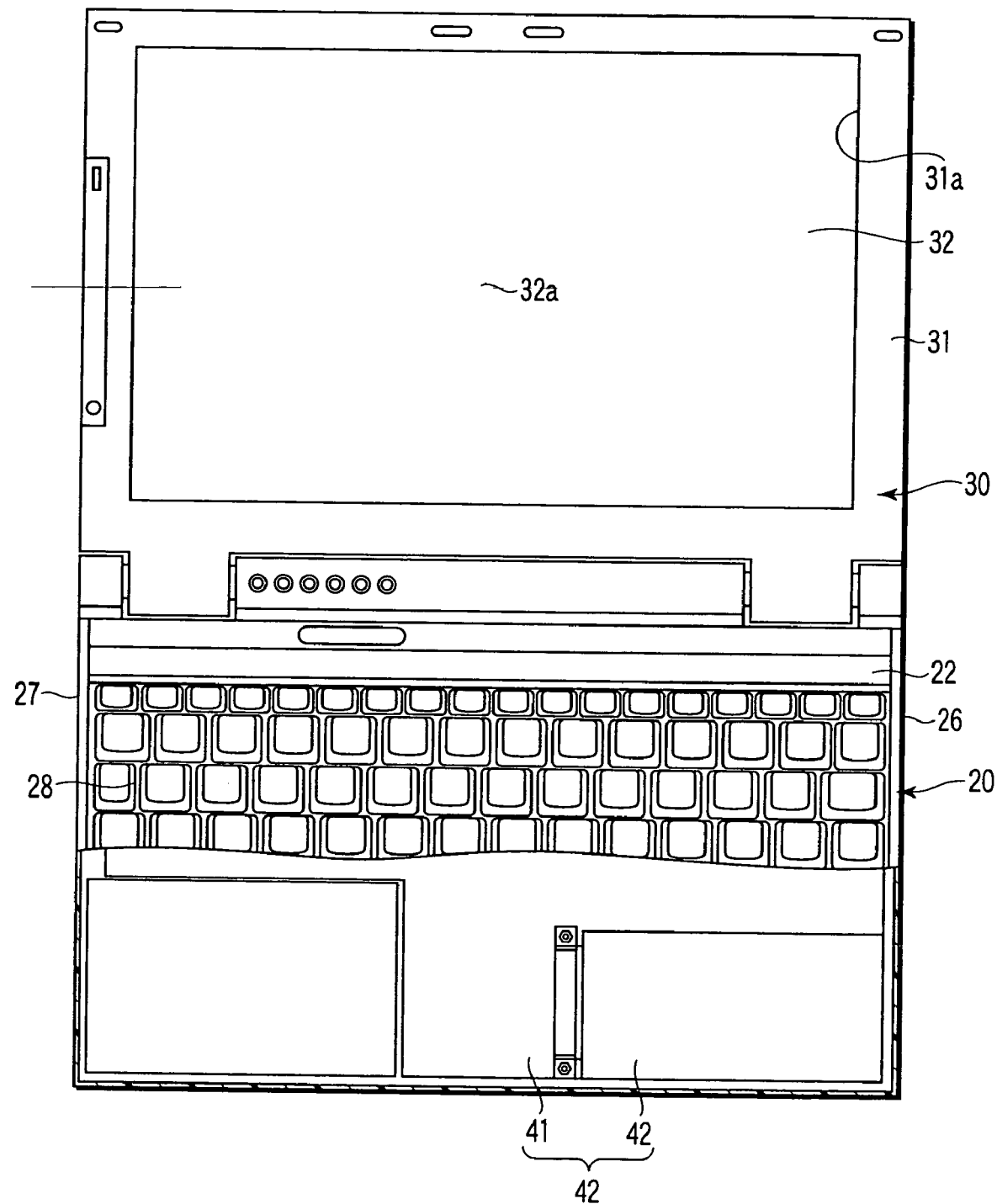
FIG. 2 is an exemplary partially cut out plan view of the embodiment of FIG. 1 with the display unit in the open position thereof.

FIG. 2 is a partially cut out plan view of the embodiment of FIG. 1 with the display unit 30 in the open position thereof. In FIG. 2, the cabinet 21 is partly cut out to expose the part of the circuit module 40.

Referring to FIG. 2, the circuit module 40 has a multilayer printed wiring board 41 and electronic parts including a hard disk 42 electrically connected to the surface of the multilayer printed wiring board 41.

Figure 3:
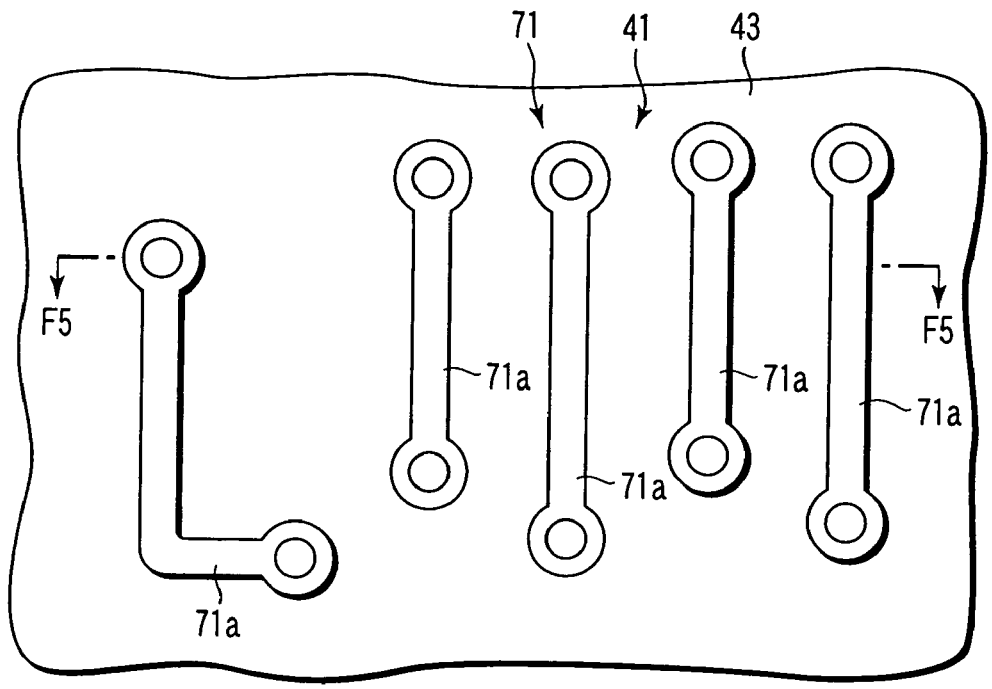
FIG. 3 is an exemplary enlarged plan view of a part of the upper surface of the multilayer printed wiring board of FIG. 2.

FIG. 3 is an enlarged plan view of a part of the upper surface 43 of the multilayer printed wiring board 41 of FIG. 2. Referring to FIG. 3, a first conductor pattern 71 is formed on the upper surface 43 of the multilayer printed wiring board 41. FIG. 3 shows part of the first conductor pattern 71.

Figure 4:
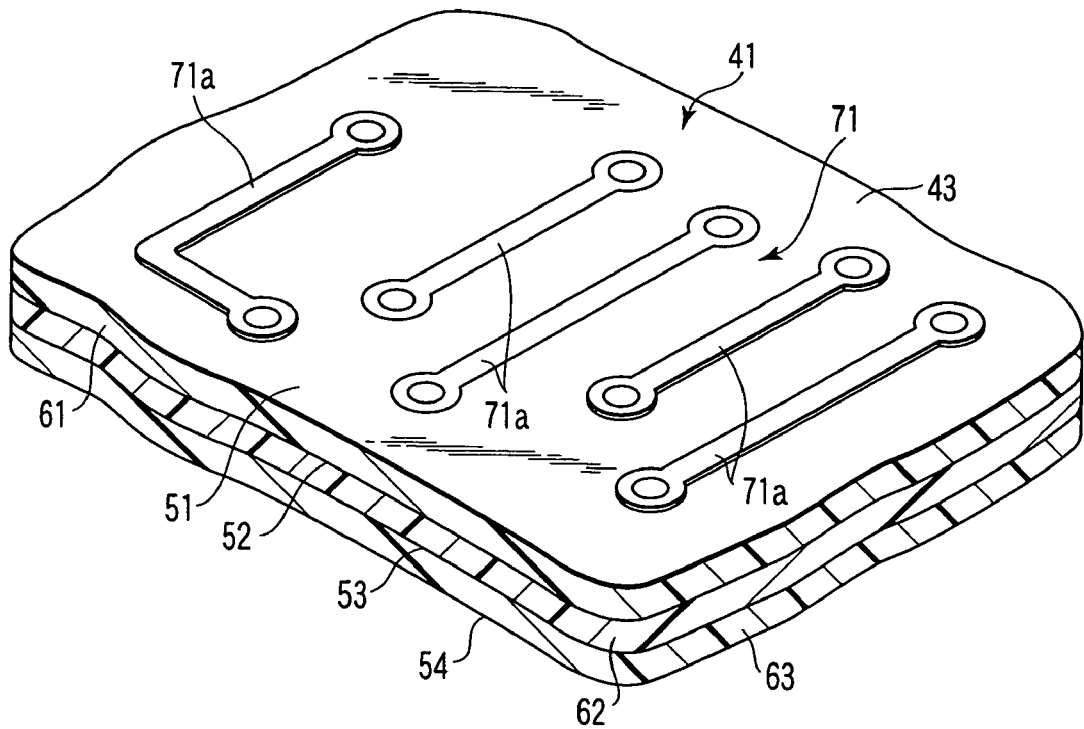
FIG. 4 is an exemplary perspective cross sectional view of the multilayer printed wiring board of FIG. 3.

FIG. 4 is a perspective cross sectional view of the multilayer printed wiring board 41 of FIG. 3, showing the layers of the multilayer printed wiring board 41 within the range of FIG. 3. As shown in FIG. 4, the multilayer printed wiring board 41 of this embodiment has four layers.

FIG. 5 is a cross sectional view of the multilayer printed wiring board 41 of FIG. 3 taken along line F5-F5 in FIG. 3. Referring to FIG. 5, the multilayer printed wiring board 41 has the first layer 51, the second layer 52, the third layer 53 and the fourth layer 54.

The first layer 51 is arranged at the top in FIG. 5 and exposed to the outside. In other words, the first layer 51 provides the upper surface 43 of the multilayer printed wiring board 41. The second layer 52 is arranged under the first layer 51. The third layer 53 is arranged under the second layer 52. The fourth layer 54 is arranged under the third layer 53 and exposed to the outside. In other words, the fourth layer 54 is the lower surface 45 of the multilayer printed wiring board 41.

A first insulating layer 61 is formed between the first layer 51 and the second layer 52. A second insulating layer 62 is formed between the second layer 52 and the third layer 53. A third insulating layer 63 is formed between the third layer 53 and the fourth layer 54. The first through third insulating layers 61 through 63 are for example made of epoxy resin.

Referring to FIGS. 4 and 5, a first conductor pattern 71 is formed on the first layer 51. The first conductor pattern 71 is formed by using a plurality of wiring members 71a. As shown in FIG. 5, a second conductor pattern 72 is formed on the second layer 52. The second conductor pattern 72 is formed by using a plurality of wiring members 72a. The first electronic part 81 and the second electronic part 82 are electrically connected to the second conductor pattern 72. The second layer 52 is a mount layer as expressed herein for the purpose of the present invention. The second conductor pattern 72 is a mount layer conductor pattern as expressed herein for the purpose of the present invention.

The third electronic part 83 is electrically connected to the second electronic part 82. The second electronic part 82 and the third electronic part 83 respectively include element parts 82a, 83a and housings 82b, 83b for containing the element parts 82a, 83a. The housings 82b, 83b are made of an electrically conductive material such as metal. The housing 82b is electrically connected to the second conductor pattern 72. The second and third electronic parts 82, 83 are for example a chip resistor and a chip capacitor.

The housing 82b of the second electronic part 82 and the housing 83b of the third electronic part 83 are electrically connected and rigidly secured to each other. Then, the second electronic part 82 and the third electronic part 83 are electrically connected to each other as the housing 82b and the housing 83b are electrically connected to each other.

The third electronic part 83 is connected to the second electronic part 82 at the side of the first layer 51. The third electronic part 83 is electrically connected to the first conductor pattern 71. The housing 83b is electrically connected to the first conductor pattern 71. As a result, the first layer 51 and the second layer 52 are electrically connected to each other.

The first layer 51 is an opposite layer as expressed herein for the purpose of the present invention. The first conductor pattern 71 is an opposite layer conductor pattern as expressed herein for the purpose of the present invention. The second electronic part 82 is a first connector member as expressed herein for the purpose of the present invention, and the third electronic part 83 is a second connector member as expressed herein for the purpose of the present invention.

Solder 90 is an example of electrically conductive adhesive as expressed herein for the purpose of the present invention. However, electrically conductive adhesives that can be used for the purpose of the present invention is by no means limited to solder 90. An anisotropic electrically conductive adhesive may be used as electrically conductive adhesive for the purpose of the present invention. In short, the electrically conductive adhesive is required only to electrically connect and rigidly secure the second electronic part 82 and the third electronic part 83 relative to each other.

A third conductor pattern 73 is formed on the third layer 53. The third conductor pattern 73 is formed by using a plurality of wiring members 73a. A fourth electronic part 84 and a fifth electronic part 85 are electrically connected to the third conductor pattern 73. A sixth electronic part 86 is electrically connected to the third electronic part 85. The sixth electronic part 86 is connected to the fifth electronic part 85 at the side of the fourth layer 54. The fifth and sixth electronic parts 85, 86 are typically a chip resistor and a chip capacitor.

The fifth electronic part 85 and the sixth electronic part 86 respectively include element parts 85a, 86a and housings 85b, 86b for containing the element parts 85a, 86a. The housings 85b, 86b are made of an electrically conductive material such as metal. The housings 85b, 86b are electrically connected and rigidly secured to each other by means of solder 90 that operates as electrically conductive adhesive. As a result, the fifth electronic part 85 and the sixth electronic part 86 are electrically connected to each other. The housing 85b is electrically connected to the third conductor pattern 73.

A first via 91 is formed in the second insulating layer 62 to extend from the second layer 52 to the third layer 53. The first via 91 is produced as the through hole formed between the second layer 52 and the third layer 53 is plated.

The first via 91 is electrically connected to the second conductor pattern 72 and the third conductor pattern 73. Thus, the second conductor pattern 72 and the third conductor pattern 73 are electrically connected to each other.

A fourth conductor pattern 74 is formed on the fourth layer 54. The fourth conductor pattern 74 is formed by using a plurality of wiring members 74a. A second via 92 is formed to extend from the first layer 51 to the fourth layer 54. The second via 92 is produced as the through hole formed between the first layer 51 and the fourth layer 54 is plated. The second via 92 is electrically connected to the first conductor pattern 71 and the fourth conductor pattern 74. Thus, the first conductor pattern 71 and the fourth conductor pattern 74 are electrically connected to each other.

The sixth electronic part 86 is electrically connected to the fourth conductor pattern 74. The housing 86b is electrically connected to the fourth conductor pattern 74. Thus, the third conductor pattern 73 and the fourth conductor pattern 74 are electrically connected to each other by way of the fifth and sixth electronic parts 85, 86.

Now, the method of manufacturing the multilayer printed wiring board 41 will be described below.

Firstly, the first printed wiring board 101 that operates as the core is formed. FIG. 6 is a cross sectional view of the first printed wiring board of the multilayer printed wiring board of this embodiment. The first printed wiring board 101 participates in the multilayer printed wiring board 41 to form the second insulating layer 62, the second conductor pattern 72, the third conductor pattern 73, the first via 91 and the first through sixth electronic parts 81 through 86. The third and sixth electronic parts 83, 86 are not shown in FIG. 6.

In other words, the first printed wiring board 101 includes the second insulating layer 62, the second conductor pattern 72, the first electronic part 81, the second electronic part 82, the third conductor pattern 73, the fourth electronic part 84 and the fifth electronic part 85.

Figure 7:
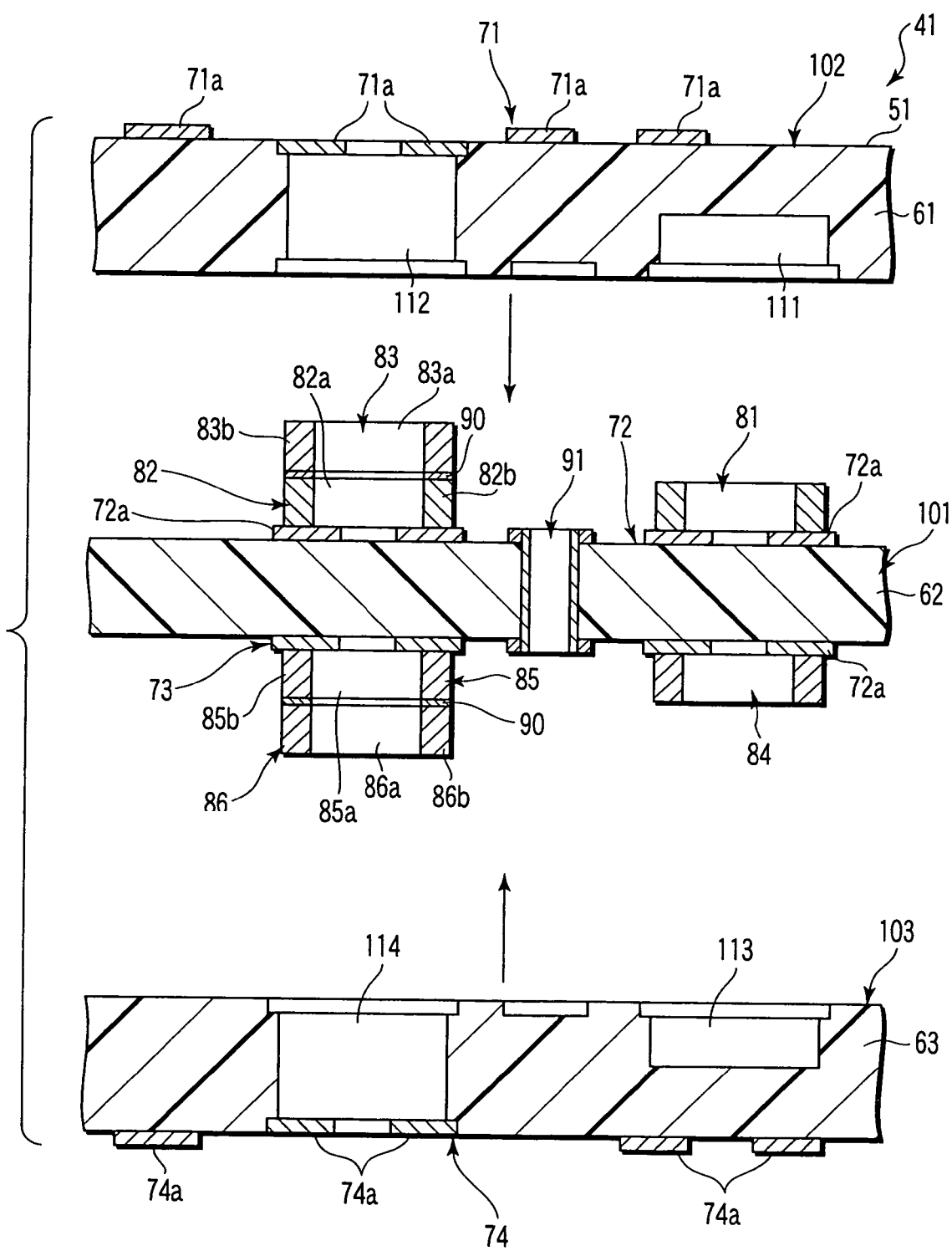
FIG. 7 is an exemplary cross sectional view of the multilayer printed wiring board of the first embodiment of the present invention, illustrating a manufacturing step thereof.

After electrically connecting the second electronic part 82 to the second conductor pattern 72 as shown in FIG. 6, the third electronic part 83 is electrically connected to the second electronic part 82 by mean of the solder 90 as shown in FIG. 7. Similarly, after electrically connecting the fifth electronic part 85 to the third conductor pattern 73 as shown in FIG. 6, the sixth electronic part 86 is electrically connected to the fifth electronic part 85 by means of the solder 90 as shown in FIG. 7.

The first printed wiring board 101 is not of the multilayer type. Therefore, the first via 91 is formed as a through hole is formed all the way through the second insulating layer 62 and plated.

FIG. 7 is a cross sectional view of the multilayer printed wiring board 41 of this embodiment, illustrating a manufacturing step thereof. Referring to FIG. 7, the second printed wiring board 102 and the third printed wiring board 103 are laid on the first printed wiring board 101 by way of a press process. The first printed wiring board 101 is a mount side body for forming a multilayer thereon as expressed herein for the purpose of the present invention. The second printed wiring board 102 is an opposite side body for forming a multilayer thereon as expressed herein for the purpose of the present invention. The third printed wiring board 103 is also an opposite side body for forming a multilayer thereon as expressed herein for the purpose of the present invention.

The second printed wiring board 102 participates in the multilayer printed wiring board 41 to form the first insulating layer 61 and the first conductor pattern 71. Thus, the second printed wiring board 102 includes the first insulating layer 61 and the first conductor pattern 71.

A first containing section 111 is formed in the first insulating layer 61 to contain the first electronic part 81 therein. A second containing section 112 is also formed in the first insulating layer 61 to contain the second and third electronic parts 82, 83 therein so that the third electronic part 83 is electrically connected to the first conductor pattern 71.

The third printed wiring board 103 participates in the multilayer printed wiring board 41 to form the third insulating layer 63 and the fourth conductor pattern 74. Thus, the third printed wiring board 103 includes the third insulating layer 63 and the fourth conductor pattern 74.

A third containing section 113 is formed in the third insulating layer 63 to contain the fourth electronic part 84. A fourth containing section 114 is also formed in the third insulating layer 63 to contain the fifth and sixth electronic parts 85, 86 therein so that the sixth electronic part 86 is electrically connected to the fourth conductor pattern 74.

Figure 8:
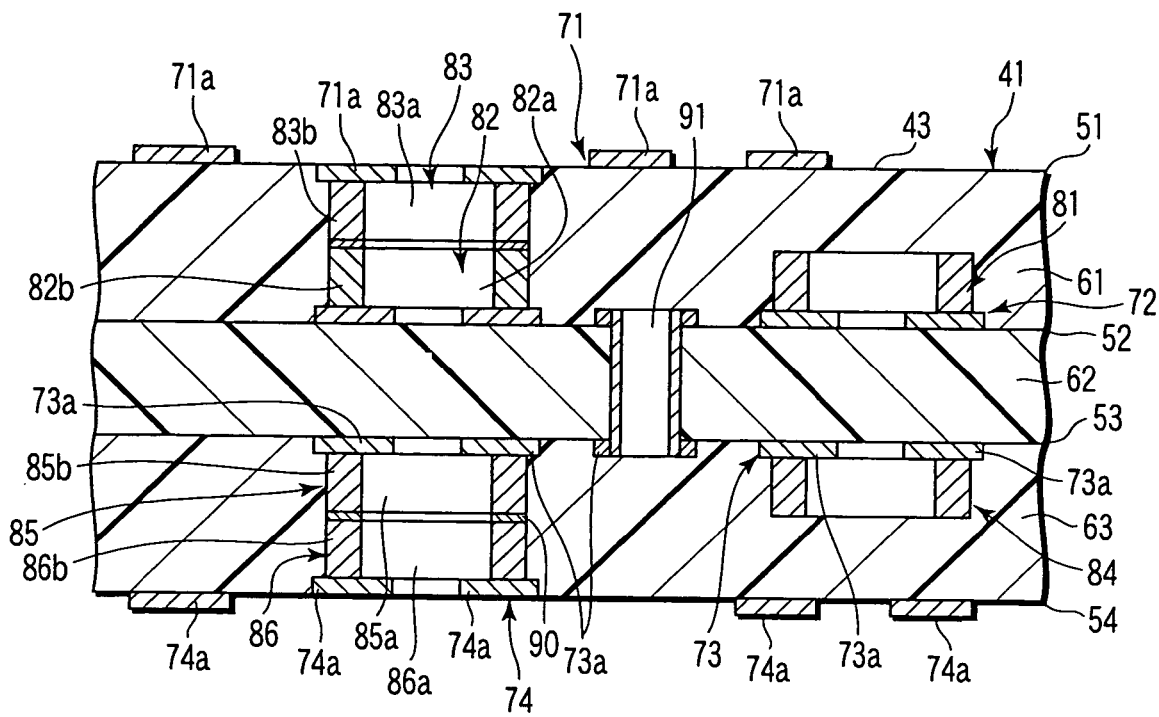
FIG. 8 is an exemplary cross sectional view of the multilayer printed wiring board of the first embodiment, illustrating the second and third printed wiring boards laid on the first printed wiring board by way a press process.

When the second and third printed wiring board 102, 103 that are formed in a manner as described are laid on the first printed wiring board 101, the first and third insulating resin layers 61, 63 are put into a semi-hardened state. FIG. 8 is a cross sectional view of the multilayer printed wiring board 41 of this embodiment, illustrating the second and third printed wiring boards 102, 103 laid on the first printed wiring board 101 by way of a press process.

As the second and third printed wiring boards 102, 103 are laid on the first printed wiring board 101 by way of a press process, the boundary of the first printed wiring board 101 and the second printed wiring board 102 makes the second layer 52, whereas the boundary of the second printed wiring board 102 and the third printed wiring board 103 makes the third layer 53.

Additionally, the housing 83b of the third electronic part 83 is electrically connected to the first conductor pattern 71. Therefore the first conductor pattern 71 and the second conductor pattern 72 are electrically connected to each other. In other words, the second electronic part 82 and the third electronic part 83 operate as electrically conductive connectors as expressed herein for the purpose of the present invention.

Similarly, the housing 86b of the sixth electronic part 86 is electrically connected to the fourth conductor pattern 74. Therefore the third conductor pattern 73 and the fourth conductor pattern 74 are electrically connected to each other. In other words, the fifth electronic part 85 and the sixth electronic part 86 operate as electrically conductive connectors as expressed herein for the purpose of the present invention.

After laying the second and third printed wiring boards 102, 103 on the first printed wiring board 101 by way of a press process, the second via 92 is formed as shown in FIG. 5.

In the portable computer 10 having the above described configuration, the second electronic part 82 and the third electronic part 83 are electrically connected to each other and then the first conductor pattern 71 and the second conductor pattern 72 are electrically connected to each other by way of the second and third electronic parts 82, 83 that are laid on the other.

Thus, in the multilayer printed wiring board 41 containing electronic parts between layers, it is possible to electrically connect the conductor patterns formed on the oppositely disposed layers with electronic parts interposed between them, which are the first conductor pattern 71 and the second conductor pattern 72 in this embodiment.

Similarly, the third conductor pattern 73 and the fourth conductor pattern 74 are electrically connected to each other by way of the fifth electronic part 85 and the sixth electronic part 86.

As described above, according to the present invention, it is possible to electrically connect the conductor patterns formed on the oppositely disposed layers with electronic parts interposed between them in a multilayer printed wiring board that contains electronic parts between layers. Thus, as a result, the degree of freedom of conductor patterns is raised.

Additionally, as the second and third electronic parts 82, 83 that operate as connectors are rigidly bonded to each other by means of an electrically conductive adhesive such as solder 90, the risk of releasing the electronic connection of the second and third electronic parts 82, 83 is suppressed.

As the second printed wiring board 102 and the third printed wiring board 103 are laid on the first printed wiring board 101 having the second and third electronic parts 82, 83 that operate as connectors and also the fifth and sixth electronic parts 85, 86 that operate as connectors as well to form a multilayer structure by way of a press process, the connectors are consequently connected to the conductor patterns that are formed in the layers where the connectors are arranged vis-à-vis so that it is possible to electrically connect patterns formed on oppositely disposed layers with electronic parts interposed between them without forming a via or the like.

Now, the second embodiment of an electronic apparatus, which is a portable computer like the first embodiment, will be described below by referring to FIG. 9. Note that the components same as or similar to those of the first embodiment are denoted respectively by the same reference symbols and will not be described any further.

This embodiment differs from the first embodiment in terms of the structure of the connectors. Otherwise, this embodiment is same as the first embodiment and hence only the difference will be described specifically below.

Figure 9:
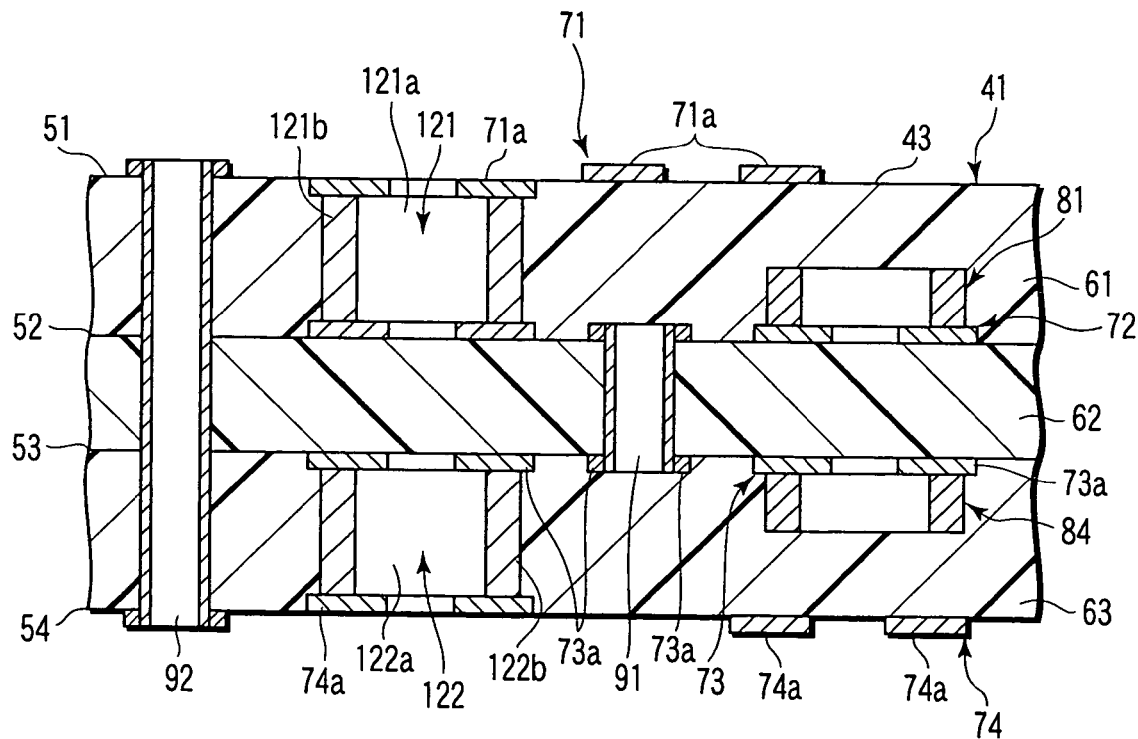
FIG. 9 is an exemplary cross sectional view of the multilayer printed wiring board of the second embodiment of the present invention.

FIG. 9 is a cross sectional view of the multilayer printed wiring board 41 of the second embodiment of the present invention. Referring to FIG. 9, the second and third electronic parts 82, 83 of the first embodiment are replaced by a seventh electronic part 121 that operates as a connector for electrically connecting the first conductor pattern 71 and the second conductor pattern 72.

The seventh electronic part 121 has a height good for connecting the second conductor pattern 72 and the first conductor pattern 71. The seventh electronic part 121 has an element part 121a and a housing 121b for containing the element part 121a.

The housing 121b is an electrically conductive member for example made of metal. The housing 121b is electrically connected to the first conductor pattern 71 and the second conductor pattern 72. Thus, the first conductor pattern 71 and the second conductor pattern 72 are electrically connected to each other.

Similarly, the fifth and sixth electronic parts 85, 86 of the first embodiment are replaced by an eighth electronic part 122 that operates as a connector for electrically connecting the third conductor pattern 73 and the fourth conductor pattern 74.

The eighth electronic part 122 has a height good for connecting the third conductor pattern 73 and the fourth conductor pattern 74. The eighth electronic part 122 has an element part 122a and a housing 122b for containing the element part 122a.

The housing 122b is an electrically conductive member for example made of metal. The housing 122b is electrically connected to the third conductor pattern 73 and the fourth conductor pattern 74. Thus, the third conductor pattern 73 and the fourth conductor pattern 74 are electrically connected to each other.

The above-described method of manufacturing a multilayer printed wiring board 41 of the first embodiment can be used for manufacturing the multilayer printed wiring board 41 of this embodiment having the above described configuration. Thus, after electrically connecting the seventh electronic part 121 and the eighth electronic part 122 respectively to the second conductor pattern 72 and the third conductor pattern 73, the seventh electronic part 121 is electrically connected to the first conductor pattern 71 as the second and third printed wiring boards 102, 103 are laid on the first printed wiring board 101 to form a multilayer structure by way of a press process. Similarly, the eighth electronic part 122 is electrically connected to the fourth conductor pattern 74.

An electrically conductive connector may be made of a single electronic part as in this embodiment. The number of parts is reduced as an electrically conductive connector is made of a single electronic part. Thus, this embodiment provides an advantage of simplifying the process of manufacturing the multilayer printed wiring board 41 and hence reducing the cost of the multilayer printed wiring board 41 in addition to the advantages of the first embodiment.

Figure 10:
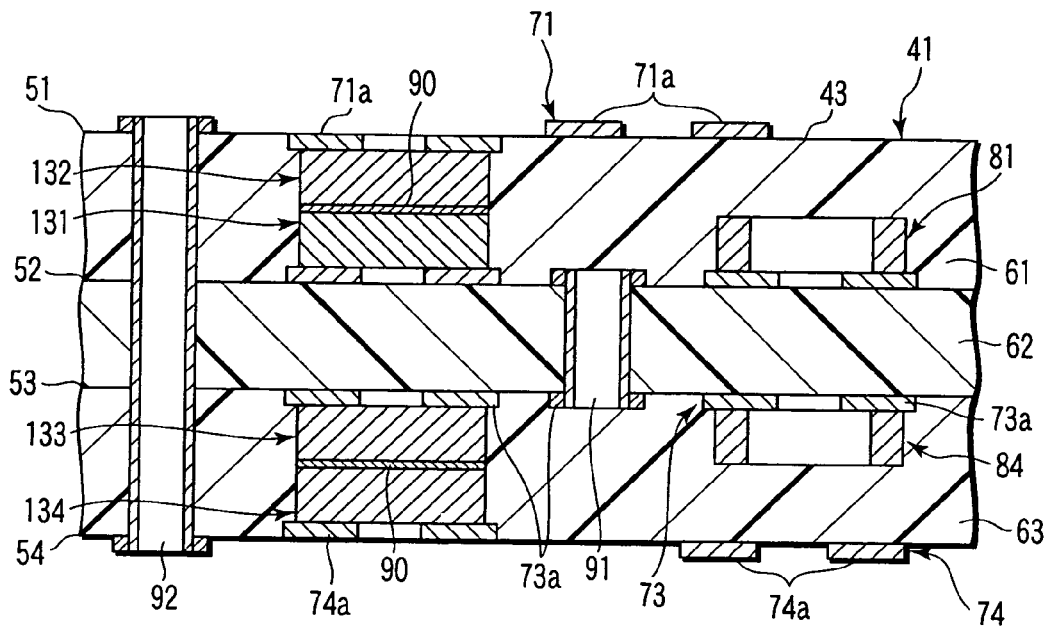
FIG. 10 is an exemplary cross sectional view of the multilayer printed wiring board of the third embodiment of the present invention.

Now, the third embodiment of an electronic apparatus, which is a portable computer like the first embodiment, will be described below by referring to FIG. 10. Note that the components same as or similar to those of the first embodiment are denoted respectively by the same reference symbols and will not be described any further.

This embodiment differs from the first embodiment in that the second and third electronic parts 82, 83 that operate as electrically conductive connector are replaced by a first metal piece 131 and a second metal piece 132. Similarly, the fifth and sixth electronic parts 85, 86 that operates as electrically conductive connector are replaced by a third metal piece 133 and a fourth metal piece 134. Otherwise, this embodiment is same as the first embodiment.

The difference will be described more specifically below. FIG. 10 is a cross sectional view of the multilayer printed wiring board 41 of the third embodiment. Referring to FIG. 10, the first metal piece 131 is electrically connected to the second conductor pattern 72. The second metal piece 132 is electrically connected to the first metal piece 131 by means of solder 90. The second metal piece 132 is also electrically connected to the first conductor pattern 71 by means of solder 90. Thus, the first conductor pattern 71 and the second conductor pattern 72 are electrically connected to each other by the connector formed by the first metal piece 131 and the second metal piece 132.

The third metal piece 133 is electrically connected to the third conductor pattern 73. The fourth metal piece 134 is electrically connected to the third metal piece 133 by means of solder 90. The fourth metal piece 134 is also electrically connected to the fourth conductor pattern 74. Thus, the third conductor pattern 73 and the fourth conductor pattern 74 are electrically connected to each other by the connector formed by the third metal piece 133 and the fourth metal piece 134.

The first and third metal pieces 131, 133 operate as a first connector member as expressed herein for the purpose of the present invention. The second and fourth metal pieces 132, 234 operate as second connector member as expressed herein for the purpose of the present invention.

The second and third electronic parts of the first embodiment are replaced by the first and second metal pieces 131, 132 and the fifth and sixth electronic parts 85, 86 of the first embodiment are replaced by the third and fourth metal pieces 133, 134 in the multilayer printed wiring board 41 of this embodiment. Thus, the method of manufacturing a multilayer printed wiring board 41 as described above for the first embodiment is also applicable to this embodiment.

This embodiment provides advantages similar to those of the first embodiment.

Now, the fourth embodiment of electronic apparatus, which is a portable computer 10 like the third embodiment, will be described below by referring to FIG. 11. Note that the components same as or similar to those of the third embodiment are denoted respectively by the same reference symbols and will not be described any further.

This embodiment differs from the third embodiment in terms of the structure of the connectors. Otherwise, this embodiment is same as the third embodiment. Now, the difference will be specifically described below.

Figure 11:
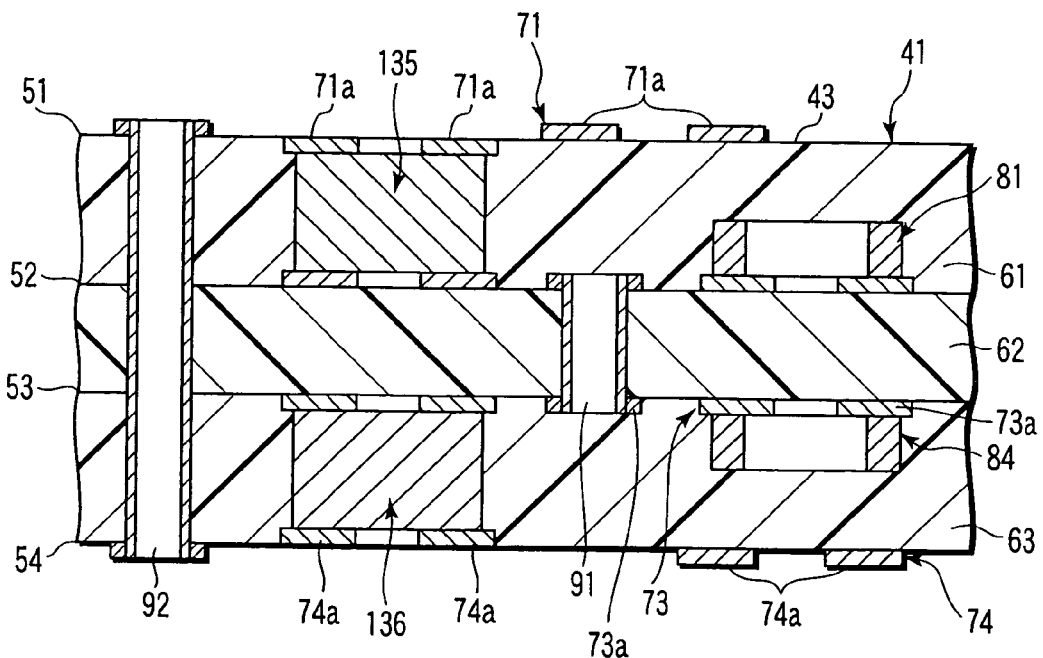
FIG. 11 is an exemplary cross sectional view of the multilayer printed wiring board of the fourth embodiment of the present invention.

FIG. 11 is a cross sectional view of the multilayer printed wiring board 41 of the fourth embodiment. The first and second metal pieces 131, 132 that operate as a connector for electrically connecting the first conductor pattern 71 and the second conductor pattern 72 in the third embodiment are replaced by a fifth metal piece 135 in this embodiment.

The fifth metal piece 135 has a height good for electrically connecting the first conductor pattern 71 and the second conductor pattern 72.

Similarly, the third and fourth metal pieces 133, 134 that operate as a connector for electrically connecting the third conductor pattern 73 and the fourth conductor pattern 74 in the third embodiment are replaced by a sixth metal piece 136 in this embodiment. The sixth metal piece 136 has a height good for electrically connecting the third conductor pattern 73 and the fourth conductor pattern 74.

When manufacturing the multilayer printed wiring board 41 of this embodiment, the fifth and sixth metal pieces 135, 136 are fitted to the first printed wiring board 101. As the second and third printed wiring boards 102, 103 are laid on the first printed wiring board 101 to which the fifth and sixth metal pieces 135, 136 are fitted to form a multilayer structure by way of a press process, the fifth metal piece 135 is electrically connected to the first conductor pattern 71. Similarly, the sixth metal piece 136 is electrically connected to the fourth conductor pattern 74.

Thus, an electrically conductive connector may be made of a single metal piece as in this embodiment. The number of parts is reduced as an electrically conductive connector is made of a single metal piece. Thus, this embodiment provides an advantage of simplifying the process of manufacturing the multilayer printed wiring board 41 and hence reducing the cost of the multilayer printed wiring board 41 in addition to the advantages of the third embodiment.

Now, the fifth embodiment of an electronic apparatus, which is a portable computer 10 like the first embodiment, will be described below by referring to FIGS. 12 through 16. Note that the components same as or similar to those of the first embodiment are denoted respectively by the same reference symbols and will not be described any further.

This embodiment differs from the first embodiment in terms of the structure of the multilayer printed wiring board 41. Otherwise, this embodiment is same as the third embodiment. Now, the difference will be specifically described below.

Figure 14:
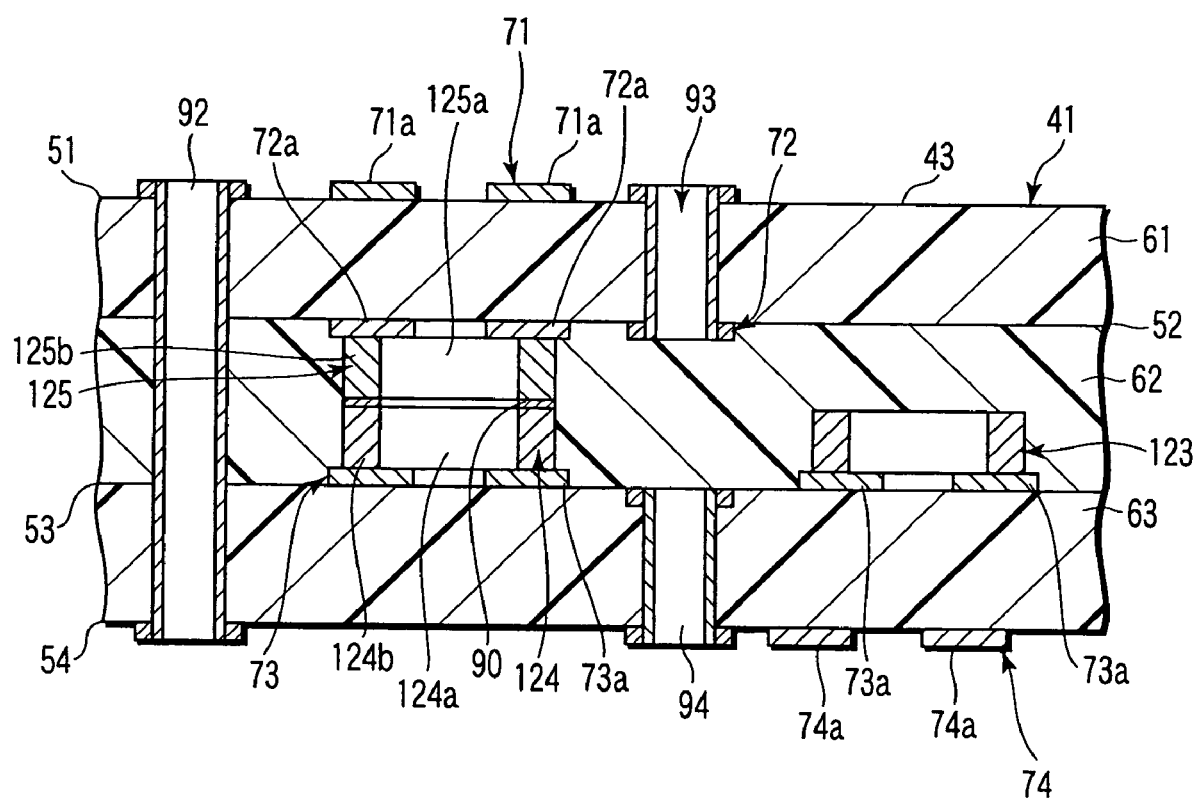
FIG. 14 is an exemplary cross sectional view of the multilayer printed wiring board of FIG. 12 taken along line F14-F14 in FIG. 12.

FIG. 12 is an enlarged plan view of the first conductor pattern 71 formed on the upper surface 43 of the multilayer printed wiring board 41 of this embodiment. FIG. 13 is a cross sectional view of the multilayer printed wiring board 41 of this embodiment, illustrating the range shown in FIG. 12 as viewed obliquely from above. FIG. 14 is a cross sectional view of the multilayer printed wiring board 41 of FIG. 12 taken along line F14-F14 in FIG. 12.

Referring to FIG. 14, the first conductor pattern 71 and the second conductor pattern 72 are electrically connected to each other by way of a third via 93 in this embodiment. The third via 93 is produced as the through hole extending from the first layer 51 to the second layer 52 is plated.

A ninth electronic part 123 and a tenth electronic part 124 are electrically connected to the third conductor pattern 73. An eleventh electronic part 125 is electrically connected to the tenth electronic part 124 by means of solder 90.

The eleventh electronic part 125 is electrically connected to the tenth electronic part 124 at the side of the second layer 52. The tenth and eleventh electronic parts 124, 125 are for example a chip resistor and a chip capacitor.

The tenth and eleventh electronic parts 124, 125 respectively include element sections 124a, 125a and metal-made housings 124b, 125b for containing the element parts 124a, 125a. The tenth and eleventh electronic parts 124, 125 are electrically connected to each other as their housings 124b, 125b are rigidly secured to each other by means of solder 90.

The housing 124b is electrically connected to the third conductor pattern 73. The housing 125b is electrically connected to the second conductor pattern 72. Thus, the second conductor pattern 72 and the third conductor pattern 73 are electrically connected to each other by means of the tenth and eleventh electronic parts 124, 125. The tenth and eleventh electronic parts 124, 125 operate as a connector as expressed herein for the purpose of the present invention.

A fourth via 94 is formed between the third conductor pattern 73 and the fourth conductor pattern 74. The fourth via 94 electrically connects the third conductor pattern 73 and the fourth conductor pattern 74 to each other. The fourth via 94 is produced as the through hole formed to extend from the third layer 53 to the fourth layer 54 is plated.

Figure 15:
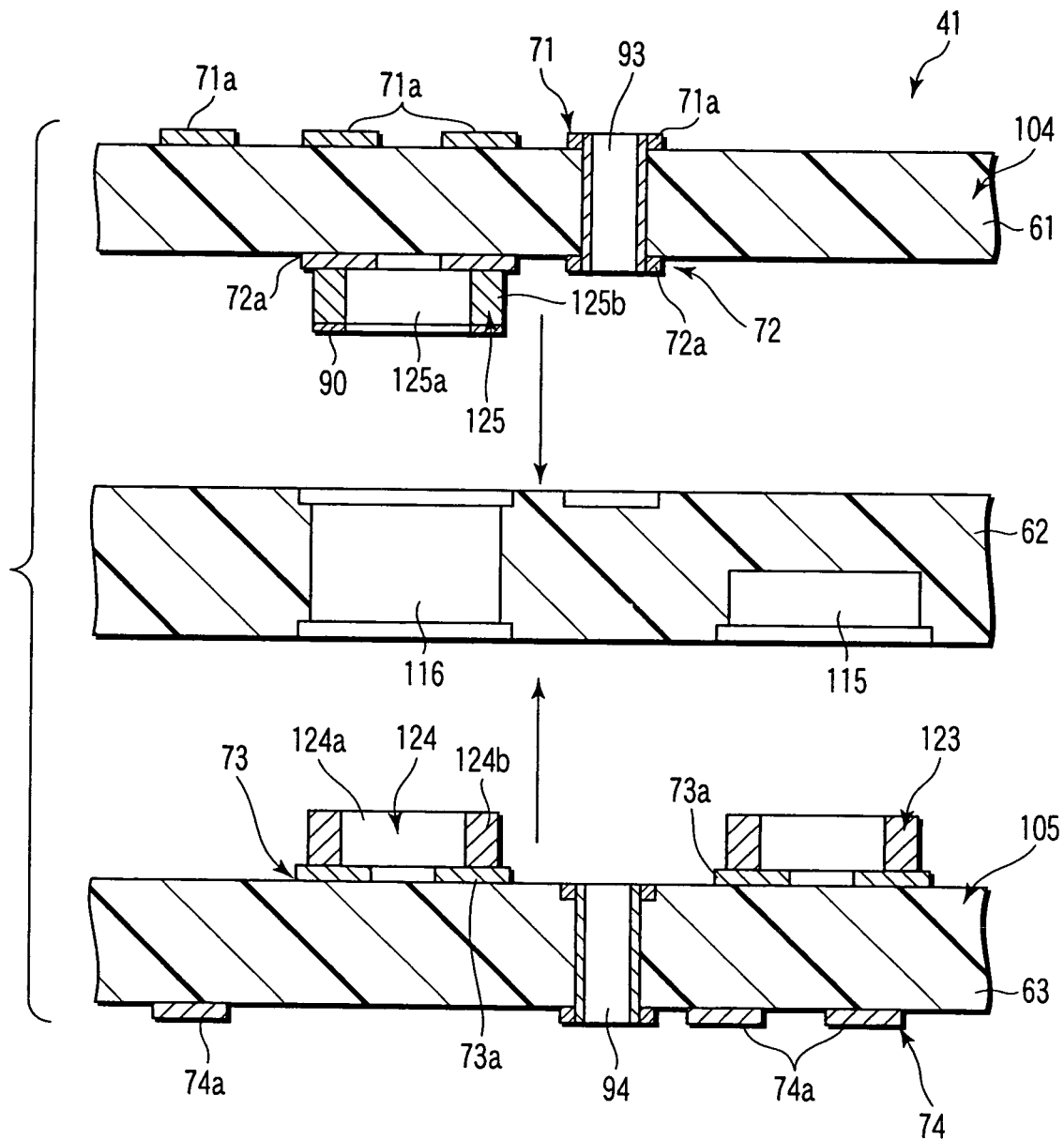
FIG. 15 is an exemplary cross sectional view of the multilayer printed wiring board of the fifth embodiment of the present invention, illustrating a manufacturing step thereof.

Now, the method of manufacturing the multilayer printed wiring board 41 of this embodiment will be described below. FIG. 15 is a cross sectional view of the multilayer printed wiring board 41 of this embodiment, illustrating a manufacturing step thereof. Referring to FIG. 15, the multilayer printed wiring board 41 can be separated into a fourth printed wiring board 104, a fifth printed wiring board 105 and a second insulating layer 62. The fourth printed wiring board 104 is the first layered body for forming a multilayer thereon as expressed herein for the purpose of the present invention. The eleventh electronic part 125 is the first connector member as expressed herein for the purpose of the present invention. The fifth printed wiring board 105 is the second layered body for forming a multilayer thereon as expressed herein for the purpose of the present invention. The tenth electronic part 124 is the second connector member as expressed herein for the purpose of the present invention. The second insulating layer 62 is the third layered body for forming a multilayer thereon as expressed herein for the purpose of the present invention.

The fourth printed wiring board 104 provides the first insulating layer 61, the first conductor pattern 71, the second conductor pattern 72, the eleventh electronic part 125 and the third via 93 of the multilayer printed wiring board 41. In other words, the fourth printed wiring board 104 includes the first insulating layer 61, the first conductor pattern 71, the second conductor pattern 72, the eleventh electronic part 125, the third via 93 and so on.

The second conductor pattern 72 is formed on the surface of the first insulating layer 61 opposite to the surface thereof where the first conductor pattern 71 is formed. The eleventh electronic part 125 is electrically connected to the second conductor pattern 72.

The fifth printed wiring board 105 provides the third insulating layer 63, the third conductor pattern 73, the fourth conductor pattern 74, the ninth electronic part 123, the tenth electronic part 124 and the fourth via 94 of the multilayer printed wiring board 41. In other words, the fifth printed wiring board 105 includes the third insulating layer 63, the third conductor pattern 73, the fourth conductor pattern 74, the ninth electronic part 123, the tenth electronic part 124 and the fourth via 94.

The third conductor pattern 73 is formed on the surface of the third insulating layer 63 opposite to the surface thereof where the fourth conductor pattern 74 is formed.

The fifth containing section 115 for containing the ninth electronic part 123 and the sixth containing section 116 for containing the tenth and eleventh electronic parts 124, 125 are formed on the second insulating layer 62.

The fourth printed wiring board 104 and the fifth printed wiring board 105 are laid on the second insulating layer 62 to form a multilayer structure with the second insulating layer 62 interposed between them by way of a press process. At this time, the second insulating layer 62 is in a semi-hardened state.

Figure 16:
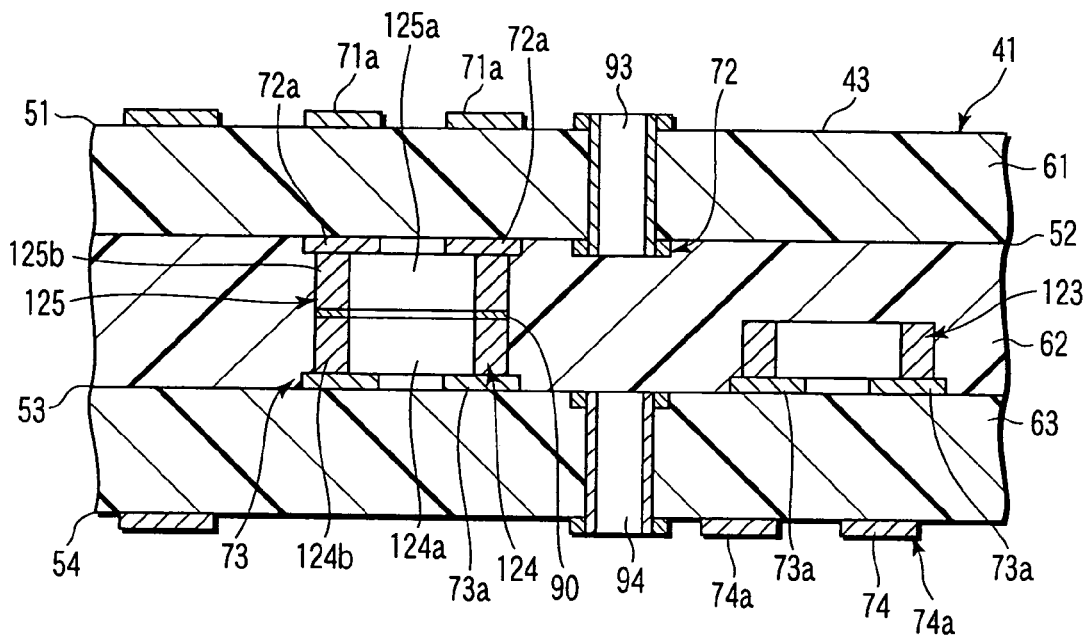
FIG. 16 is an exemplary cross sectional view of the fourth and fifth printed wiring boards laid on the second insulating layer shown in FIG. 15 by way of a press process.

FIG. 16 is a cross sectional view of the fourth and fifth printed wiring boards 104, 105 laid on the second insulating layer 62 shown in FIG. 16 to form a multilayer structure by way of a press process. As a result of the press process for forming a multilayer structure, the tenth electronic part 124 and the eleventh electronic part 125 are rigidly secured to each other by means of solder 90.

After laying the fourth and fifth printed wiring board 104, 105 on the second insulating layer 62 by way of a press process, the second via 92 is formed in a manner as illustrated in FIG. 14.

In the electronic apparatus having the above described configuration, the second conductor pattern 72 and the third conductor pattern 73 are electrically connected to each other as the tenth electronic part 124 and the eleventh electronic part 125 are laid one on the other to form a multilayer structure and electrically connected to each other. Thus, this embodiment provides advantages substantially same as those of the first embodiment.

Additionally, as the fifth printed wiring board 105 having the electronic part 124 that operates as a connector and the fourth printed wiring board 104 having the eleventh electronic part 125 that operates also as a connector are laid on the second insulating layer 62 to form a multilayer structure by way of a press process and the housings 124b, 125b are electrically connected to each other by means of solder 90, it is possible to electrically connect the conductor patterns that are formed as oppositely disposed layers with an electronic part interposed between them, the second conductor pattern 72 and the third conductor pattern 73 in this embodiment, relative to each other.

Now, the sixth embodiment of an electronic apparatus, which is a portable computer like the fifth embodiment, will be described below by referring to FIG. 17. Note that the components same as or similar to those of the fifth embodiment are denoted respectively by the same reference symbols and will not be described any further.

This embodiment differs from the fifth embodiment in terms of the structure of the connectors. Otherwise, this embodiment is same as the fifth embodiment. Now, the difference will be specifically described below.

Figure 17:
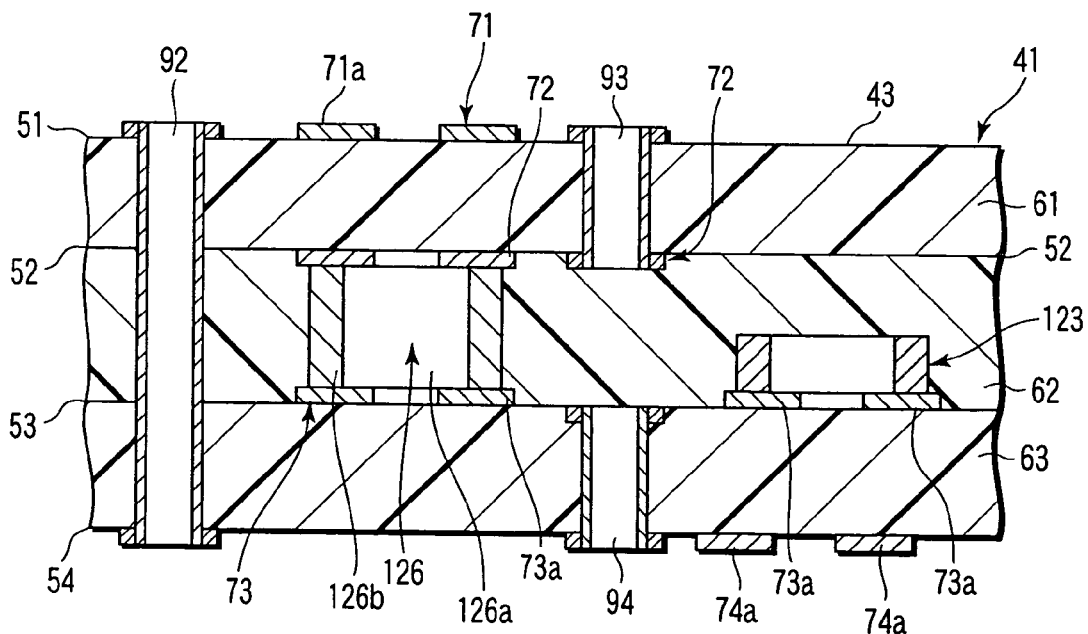
FIG. 17 is an exemplary cross sectional view of the multilayer printed wiring board of the sixth embodiment of the present invention.

FIG. 17 is a cross sectional view of the multilayer printed wiring board 41 of this embodiment. Referring to FIG. 17, a twelfth electronic part 126 is used as a connector for the purpose of electrically connecting the second conductor pattern 72 and the third conductor pattern 73. The twelfth electronic part 126 has an element part 126a and a housing 126b for containing the element part 126a.

The housing 126b has a height good for electrically connecting the second conductor pattern 72 and the third conductor pattern 73. As a result, the second and third conductor patterns 72, 73 are electrically connected to each other.

When manufacturing the multilayer printed wiring board 41 of this embodiment, the twelfth electronic part 126 may be connected to either of the fourth and fifth printed wiring boards 104, 105.

Thus, an electrically conductive connector is made of a single metal piece in this embodiment. The number of parts is reduced as an electrically conductive connector is made of a single metal piece. Thus, this embodiment provides an advantage of simplifying the process of manufacturing the multilayer printed wiring board 41 and hence reducing the cost of the multilayer printed wiring board 41 in addition to the advantages of the fifth embodiment.

Figure 18:
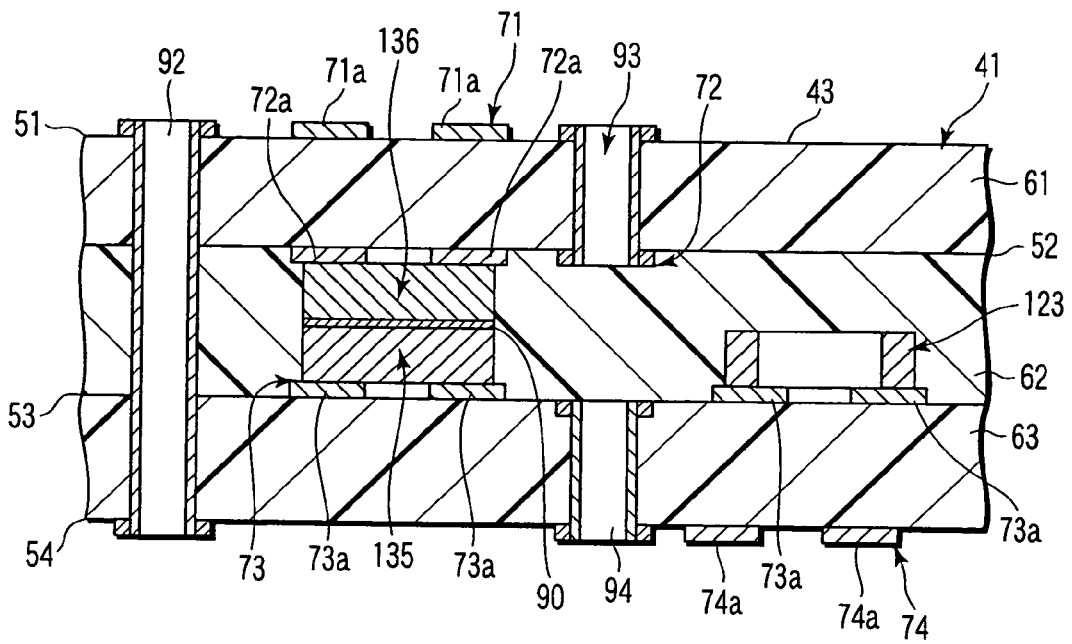
FIG. 18 is an exemplary cross sectional view of the multilayer printed wiring board of the seventh embodiment of the present invention.

Now, the seventh embodiment of an electronic apparatus, which is a portable computer like the fifth embodiment, will be described below by referring to FIG. 18. Note that the components same as or similar to those of the fifth embodiment are denoted respectively by the same reference symbols and will not be described any further.

In this embodiment, the tenth electronic part 124 is replaced by a fifth metal piece 135 and the eleventh electronic part 125 is replaced by a sixth metal piece 136. The fifth metal piece 135 is electrically connected to the third conductor pattern 73. The sixth metal piece 136 is electrically connected to the second conductor pattern 72. The fifth and sixth metal pieces 135, 136 are electrically connected to each other by means of solder 90. Thus, the second and third conductor patterns 72, 73 are electrically connected to each other.

The method of manufacturing the multilayer printed wiring board 41 of the fifth embodiment may also be used for this embodiment.

This embodiment, in which metal pieces are used as connectors for connecting conductor patterns disposed opposite relative to each other with electronic parts interposed between them, provides advantages similar to those of the fifth embodiment.

Figure 19:
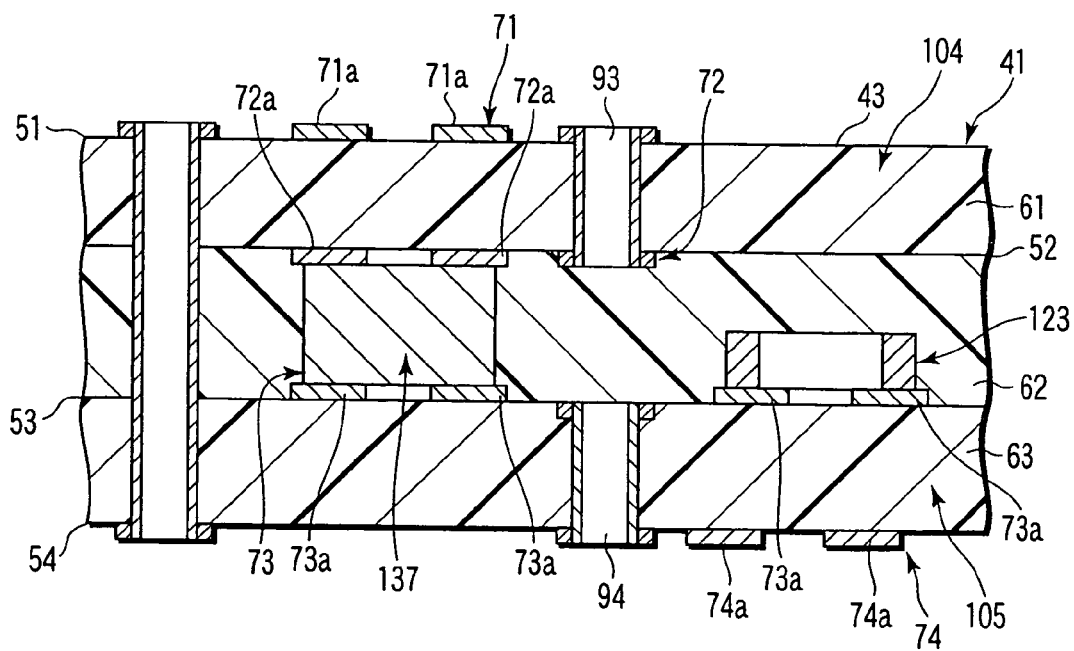
FIG. 19 is an exemplary cross sectional view of the multilayer printed wiring board of the eighth embodiment of the present invention.

Now, the eighth embodiment of an electronic apparatus, which is a portable computer like the seventh embodiment, will be described below by referring to FIG. 19. Note that the components same as or similar to those of the seventh embodiment are denoted respectively by the same reference symbols and will not be described any further.

This embodiment differs from the seventh embodiment in terms of the structure of the connectors. This will be described specifically below. FIG. 19 is a cross sectional view of the multilayer printed wiring board 41 of this embodiment. Referring to FIG. 19, the fifth and sixth metal pieces 135, 136 of the seventh embodiment are replaced by a seventh metal piece 137.

The seventh metal piece 137 has a height good for electrically connecting the second conductor pattern 72 and the third conductor pattern 73. Thus, the second conductor pattern 72 and the third conductor pattern 73 are electrically connected to each other.

When manufacturing the multilayer printed wiring board 41 of this embodiment, the seventh metal piece 173 may be connected to either of the fourth and fifth printed wiring boards 104, 105.

Thus, a connector is made of a single metal piece in this embodiment. The number of parts is reduced as an electrically conductive connector is made of a single metal piece. Thus, this embodiment provides an advantage of reducing the number of parts and hence the cost of the multilayer printed wiring board 41 in addition to the advantages of the seventh embodiment.

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A multilayer printed wiring board comprising:
   a mount layer;
   an electronic part on the mount layer;
   a mount layer conductor pattern in the mount layer;
   an opposite layer arranged opposite to the mount layer with the electronic part interposed between them;
   an opposite layer conductor pattern in the opposite layer; and
   an electrically conductive connector contained between the mount layer and the opposite layer connected to the mount layer conductor pattern and connected to the opposite layer conductor pattern,
   wherein the electrically conductive connector comprises:
   a first connector member electrically connected to the mount layer conductor pattern; and
   a second connector member electrically connected to the opposite layer conductor pattern and also electrically connected to the first connector member, and
   wherein the first connector member is an electronic part and the second connector member is also an electronic part.

2. The multilayer printed wiring board according to claim 1, wherein the connector is a metal piece.

3. The multilayer printed wiring board according to claim 1, wherein the first connector member is a metal piece; and the second connector member is also a metal piece.

4. The multilayer printed wiring board according to claim 1, wherein the first connector member and the second connector member are electrically connected to each other by means of an electrically conductive adhesive member.

5. An electronic apparatus comprising a multilayer printed wiring board having:
   a mount layer;
   an electronic part on the mount layer;
   a mount layer conductor pattern in the mount layer;
   an opposite layer containing the electronic part between itself and the mount layer;
   an opposite layer conductor pattern in the opposite layer; and
   an electrically conductive connector contained between the mount layer and the opposite layer connected to the mount layer conductor pattern and connected to the opposite layer conductor pattern,
   wherein the electrically conductive connector comprises:
   a first connector member electrically connected to the mount layer conductor pattern; and
   a second connector member electrically connected to the opposite layer conductor pattern and also electrically connected to the first connector member, and
   wherein the first connector member is an electronic part; and the second connector member is also an electronic part.

6. The electronic apparatus according to claim 5, wherein the connector is a metal piece.

7. The electronic apparatus according to claim 5, wherein the first connector member is a metal piece; and the second connector member is a metal piece.

\* \* \* \* \*